United States Patent
Ling et al.

(10) Patent No.: US 8,775,851 B2
(45) Date of Patent: Jul. 8, 2014

(54) METHOD AND SYSTEM FOR PRECISE TEMPERATURE AND TIMEBASE PPM ERROR ESTIMATION USING MULTIPLE TIMEBASES

(75) Inventors: Curtis Ling, Carlsbad, CA (US); Xing Tan, Vista, CA (US); Hyungjin Kim, Irvine, CA (US)

(73) Assignee: Maxlinear, Inc., Carlsbad, CA (US)

( * ) Notice: Subject to any disclaimer, the term of this patent is extended or adjusted under 35 U.S.C. 154(b) by 224 days.

(21) Appl. No.: 13/296,340

(22) Filed: Nov. 15, 2011

(65) Prior Publication Data

US 2012/0151244 A1 Jun. 14, 2012

Related U.S. Application Data

(60) Provisional application No. 61/422,329, filed on Dec. 13, 2010.

(51) Int. Cl.
*G06F 1/12* (2006.01)
*G01S 19/23* (2010.01)
*H03L 1/02* (2006.01)

(52) U.S. Cl.
CPC ............... *G01S 19/235* (2013.01); *H03L 1/02* (2013.01)
USPC ........................................................ 713/400

(58) Field of Classification Search
CPC ......... H03L 1/02; H03L 1/022; G01S 19/235; G06F 13/1689; G06F 1/12; G06F 1/08; G04F 7/00
USPC ................................................. 713/400–503
See application file for complete search history.

(56) References Cited

U.S. PATENT DOCUMENTS

| | | | | |
|---|---|---|---|---|
| 3,713,033 A * | 1/1973 | Frerking | ...................... | 31/116 R |
| 5,274,545 A * | 12/1993 | Allan et al. | .................... | 368/156 |
| 5,594,453 A * | 1/1997 | Rodal et al. | ............. | 342/357.65 |
| 5,883,550 A * | 3/1999 | Watanabe et al. | ............. | 331/176 |
| 5,936,571 A * | 8/1999 | Desjardins | ............... | 342/357.59 |
| 6,522,212 B1 * | 2/2003 | Kodim | .......................... | 331/176 |
| 7,010,307 B2 * | 3/2006 | Abraham | .................... | 455/456.1 |
| 7,148,761 B1 * | 12/2006 | Shieh | ............................. | 331/66 |
| 7,167,058 B2 * | 1/2007 | Meltzer | .......................... | 331/76 |
| 7,170,332 B2 * | 1/2007 | Goldfarb et al. | ............. | 327/291 |
| 7,310,064 B2 * | 12/2007 | Cobb et al. | .................... | 342/386 |
| 7,375,681 B1 | 5/2008 | Woo | | |
| 7,441,949 B2 * | 10/2008 | Janzen et al. | ................. | 374/171 |

(Continued)

FOREIGN PATENT DOCUMENTS

WO WO2010125388 11/2010

*Primary Examiner* — Paul R Myers
(74) *Attorney, Agent, or Firm* — McAndrews, Held & Malloy

(57) ABSTRACT

Methods and systems for precise temperature and timebase ppm error estimation using multiple timebases may comprise measuring a coarse reading of a temperature corresponding to the plurality of timebases. The frequencies of the timebases may be compared to generate a fine reading of the temperature based, at least in part, on the coarse reading and the comparison of the frequencies with respect to models of temperature dependencies for each of the timebases. The timebases may be calibrated utilizing the generated fine reading. The plurality of timebases may comprise different order temperature dependencies. The models of temperature dependencies of each of the plurality of timebases may be updated based, at least in part, on the fine reading of the temperature corresponding to the plurality of timebases. A global navigation satellite system (GNSS) clock signal may be utilized periodically to improve the accuracy of the calibration of the plurality of timebases.

20 Claims, 6 Drawing Sheets

(56) References Cited

U.S. PATENT DOCUMENTS

| | | | |
|---|---|---|---|
| 7,791,419 B1 * | 9/2010 | Lemkin | 331/47 |
| 8,183,937 B2 * | 5/2012 | McDonald et al. | 331/18 |
| 8,195,397 B2 * | 6/2012 | Blanz | 702/6 |
| 2005/0040904 A1 * | 2/2005 | Sakurai | 331/176 |
| 2007/0153944 A1 * | 7/2007 | Kerstenbeck et al. | 375/344 |
| 2007/0155341 A1 | 7/2007 | Haiut | |
| 2008/0198070 A1 * | 8/2008 | Wang et al. | 342/357.12 |
| 2010/0225402 A1 * | 9/2010 | Yang et al. | 331/10 |

\* cited by examiner

METHOD AND SYSTEM FOR PRECISE TEMPERATURE AND TIMEBASE PPM ERROR ESTIMATION USING MULTIPLE TIMEBASES

CROSS-REFERENCE TO RELATED APPLICATIONS/INCORPORATION BY REFERENCE

This application makes reference to and claims priority to U.S. Provisional Application Ser. No. 61/422,329 filed on Dec. 13, 2010.

FIELD OF THE INVENTION

Certain embodiments of the invention relate to communication network timing. More specifically, certain embodiments of the invention relate to a method and system for precise temperature and timebase ppm error estimation using multiple timebases.

BACKGROUND OF THE INVENTION

Accurate timing signals are needed for many electronic systems. One source of these timing signals is the crystal oscillator, which is an electronic oscillator circuit that uses the mechanical resonance of a vibrating crystal of piezoelectric material to create a clock signal with a very precise frequency. This signal is commonly used to keep track of time, to provide a stable clock signal for digital integrated circuits, and to stabilize frequencies for radio transmitters and receivers. Quartz crystals operate at frequencies from a few tens of kilohertz to tens of megahertz, and are typically used for consumer devices such as wristwatches, clocks, radios, computers, and cellphones.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for precise temperature and timebase ppm error estimation using multiple timebases, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for precise temperature and timebase ppm error estimation using multiple timebases. Exemplary aspects of the invention may comprise measuring a coarse reading of a temperature corresponding to the plurality of timebases. The frequencies of the plurality of timebases may be compared at the temperature corresponding to the pluralities of the timebases. A fine reading of the temperature corresponding to the plurality of timebases may be generated based, at least in part, on the coarse reading and the comparison of the frequencies with respect to models of temperature dependencies for each of the plurality of timebases. The plurality of timebases may be calibrated utilizing the generated fine reading of the temperature corresponding to the plurality of timebases. The plurality of timebases may comprise different order temperature dependencies. The models of temperature dependencies of each of the plurality of timebases may be updated based, at least in part, on the fine reading of the temperature corresponding to the plurality of timebases. A global navigation satellite system (GNSS) clock signal may be utilized periodically to improve the accuracy of the calibration of the plurality of timebases. The GNSS clock signal may comprise one or more of: a GPS clock signal, GLONASS clock signal, and/or a Galileo clock signal. The accuracy of the models of temperature dependencies for each of the plurality of timebases may be successively increased through one or more of: averaging, voting, and/or Kalman filtering. The plurality of timebases may be calibrated utilizing an embedded system in an integrated circuit. One or more of the plurality of timebases may be generated on the integrated circuit or coupled into the integrated circuit. One or more of the plurality of timebases may be generated by a crystal oscillator.

Figure 1:
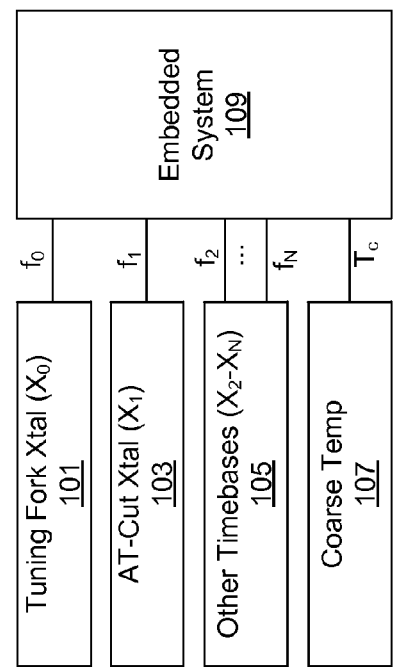
FIG. 1 is a diagram illustrating a timebase error estimation system, in accordance with an embodiment of the invention.

FIG. 1 is a diagram illustrating a timebase error estimation system, in accordance with an embodiment of the invention. Referring to FIG. 1, there is shown a timebase error estimation system 100 comprising a tuning fork crystal 101, an AT-cut crystal 103, other timebases 105, a coarse temperature sensor 107, and an embedded system 109. There is also shown output signals $X_0$-$X_N$ for each of the timebase sources at frequencies $f_0, f_1, f_2, \ldots f_N$, and a temperature reading Tc from the coarse temperature sensor 107.

The tuning fork crystal 101 may comprise a crystal oscillator where the crystal is cut in the shape of a tuning fork, which is often utilized for generating lower frequencies. Similarly, the AT-cut crystal 103 may comprise another crystal oscillator, but with the crystal cut in a particular orientation, AT-cut, which may correspond to the surface of the crystal x-axis being inclined by 35° 15' from the z (optic) axis. The frequency-temperature curve for such a crystal typically resembles a sinusoidal wave with an inflection point in the 25-35 C. temperature range.

It should be noted that the tuning fork and AT-cut crystals shown are merely exemplary clock signal sources, whereas any clock source may be utilized, as indicated by the other timebases 105, which may comprise any other type of clock source that may be coupled into the embedded system 109. In an exemplary scenario, one of the other timebases 105 may comprise a GPS clock signal that may be received periodically to further calibrate the clock signals.

The clock signals may be integrated on the same integrated circuit (chip) that comprises the embedded system 109, or may be located off-chip. Any frequency sources with distinctly different temperature dependencies may be utilized, e.g., two AT-cut crystals that have different coefficients in their temperature dependencies. Furthermore, more than two sources may be used for increased robustness and accuracy, and these additional sources may have their own temperature dependencies and associated models. The equations below illustrate typical equations which model AT-cut and tuning fork crystals, respectively.

$$\text{ppm}_{AT} = C_0 + C_1 \cdot (T-T_0) + C_2 \cdot (T-T_0)^2 + C_3 \cdot (T-T_0)^3$$

$$\text{ppm}_{TF} = B_0 + B_1 \cdot (T-T_0) + B_2 \cdot (T-T_0)^2$$

The coarse temperature sensor 107 may comprise any temperature sensing mechanism with a coarse resolution of, e.g., 0.5° C., particularly those in systems that may be implemented in integrated circuits. For example, the coarse temperature sensor 107 may comprise an integrated device with a known resistance versus temperature curve. The embedded system 109 may comprise a processor/controller system that may be operable to model the thermal dependencies for timebases, such as crystals. Accordingly, the embedded system 109 may comprise a processor and memory, for example, and may be operable to make frequency and temperature readings, calculate temperature dependencies, and store the results. The temperature dependencies for the clock signals $X_0, X_1, \ldots, X_i, \ldots X_N$ may be denoted as $TD_0, TD_1, \ldots, TD_i, \ldots TD_N$ respectively.

In many applications it may be desirable to sense the temperature of a hardware device to great precision. It may not be necessary to know the absolute temperature, but more importantly the precision with which relative temperature change can be measured. This may be particularly relevant in applications where a temperature-dependent frequency reference, or timebase, requires open-loop temperature compensation, such as is the case for GPS devices where a stable frequency reference independent of temperature change is important in aiding rapid acquisition and tracking of satellites. This is commonly accomplished by means of a temperature-controlled crystal oscillator (TCXO), which stabilizes the temperature of a frequency reference to prevent drift when the ambient temperature changes.

Figure 3:
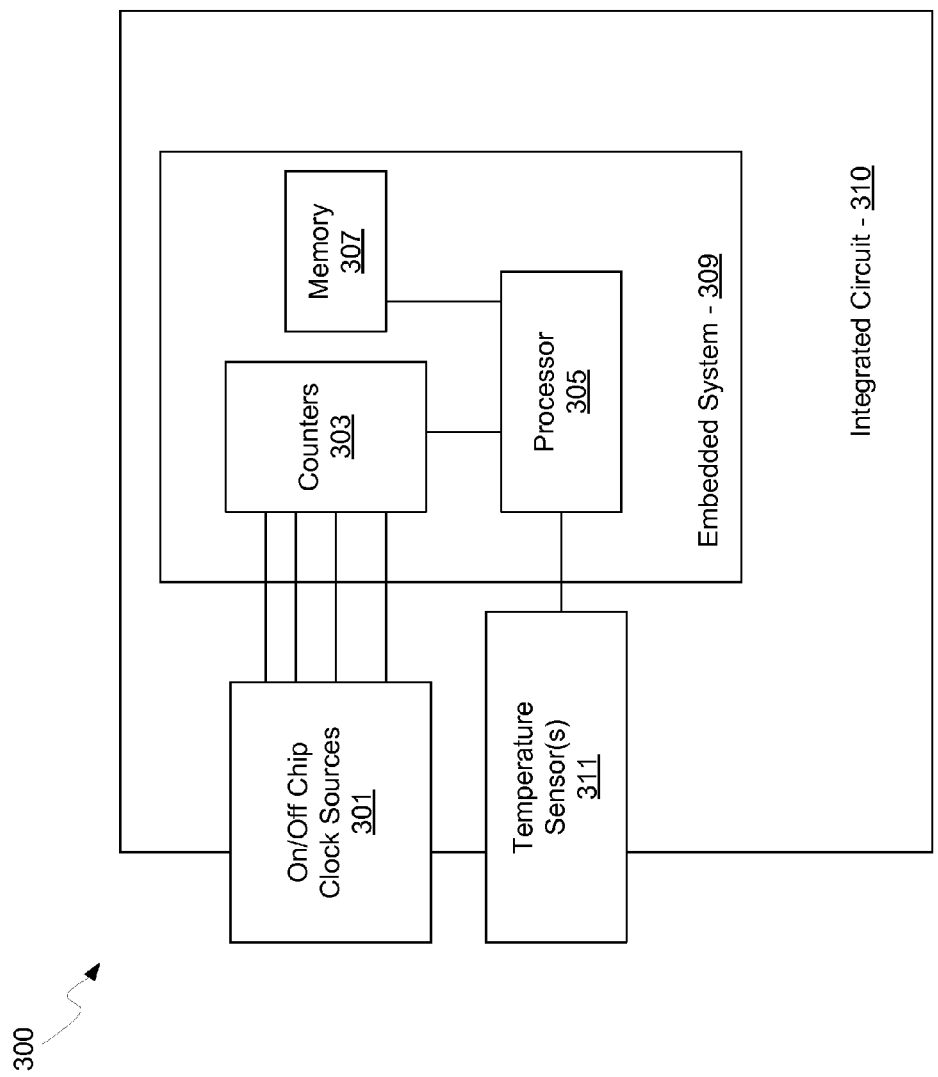
FIG. 3 is a diagram illustrating a timebase error estimation system, in accordance with an embodiment of the invention.

In an exemplary scenario, a model for $TD_i$ may be generated with its inputs being the frequency and temperature information from $X_0 \ldots X_N$ and the coarse temperature sensor 107, respectively, and results in an estimate of the crystal ppm error $PPM_i$, as described further with respect to FIG. 3. A model, $TD_{ij}$, for the relative frequencies of two frequency sources can be generated by comparing two temperature dependencies $TD_i$ and $TD_j$, for example one modeled using a second-order polynomial dependency on temperature (such as the tuning-fork crystal 101) and one with a third-order dependency on temperature (such as the AT-cut crystal 103). Alternatively, the timebases may be of the same order but each with different temperature coefficients. Frequencies may be measured or compared ("gauged") very precisely, whether against an absolute timebase such as provided by a GPS receiver ("absolute gauging"), or relative to other frequency sources ("cross gauging") against which the system requires small relative error. The relationships among these frequency sources may be measured, either from the differences among their frequencies or from the ratio of their frequencies, and the change in difference (or ratio) may be utilized to precisely measure the change in temperature from some reference point.

In an exemplary embodiment of the invention, temperature sensing may be performed precisely and quickly, with the temperature sensing localized to pertinent portions of the hardware, thereby avoiding errors due to temperature gradients. This may be accomplished with locally-available timebases, given an intermittent and infrequent gauging against an absolute timebase, such as a global navigation satellite system (GNSS), which may include GPS, GLONASS, and/or Galileo, for example. The temperature dependency models may be developed with infrequent and limited gauging.

Figure 2:
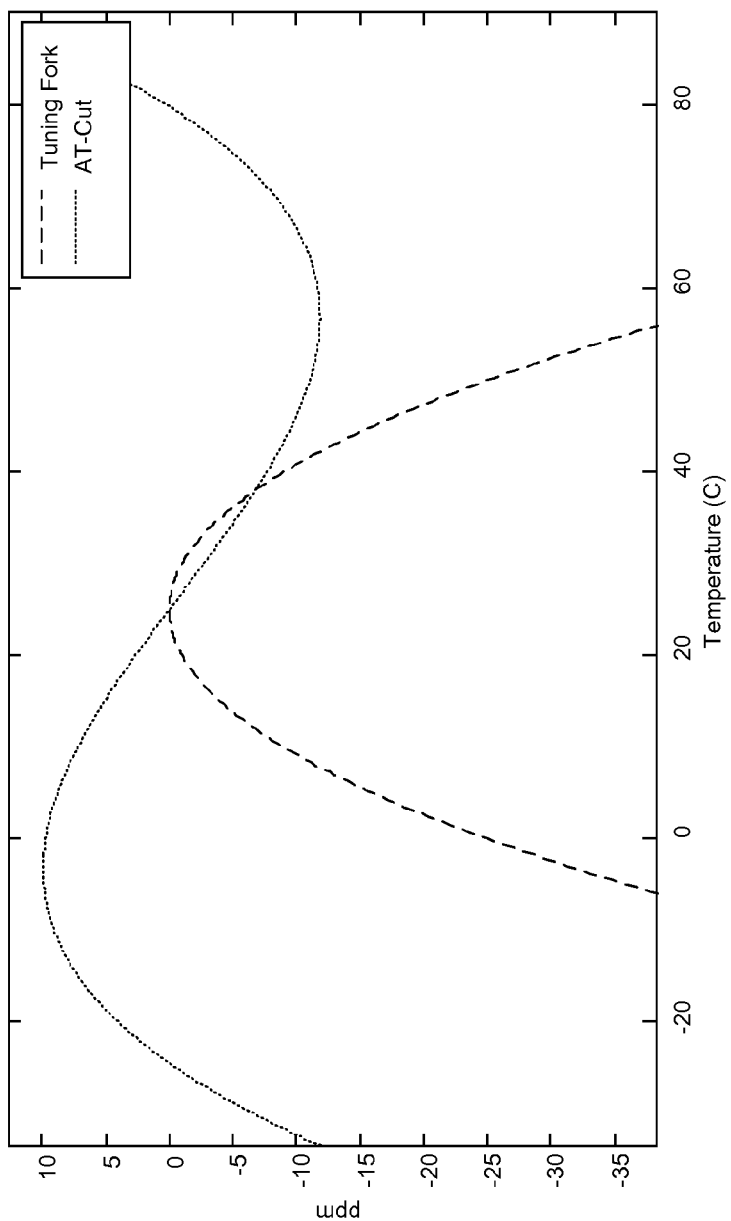
FIG. 2 is a diagram illustrating exemplary temperature dependencies for tuning fork and AT-cut crystals, in accordance with an embodiment of the invention.

FIG. 2 is a diagram illustrating exemplary temperature dependencies for tuning fork and AT-cut crystals, in accordance with an embodiment of the invention. Referring to FIG. 2, there is shown a plot of the temperature dependencies of the oscillator frequency of tuning fork and AT-cut crystals in parts-per-million. As stated above and as shown in FIG. 2, the AT-cut temperature dependency is generally a third-order polynomial in shape with an inflection point in the 25-35° C. range, while the tuning-fork temperature dependency is generally a second-order polynomial in shape with a critical point at around 25° C.

In an exemplary embodiment, the temperature dependency models are polynomials of temperature which capture the physical behavior of the timebases. For example, $TD_i$ models the ppm error as a function of temperature for a clock source $X_i$, while $TD_{ij}$ models the differential ppm error between $X_i$ and $X_j$ as a function of temperature. This may be described further with respect to FIG. 3.

FIG. 3 is a diagram illustrating a timebase error estimation system, in accordance with an embodiment of the invention. Referring to FIG. 3, there is shown timebase error system 300 comprising on/off-chip clock sources 301 and an integrated circuit 310 comprising an embedded system 309 and temperature sensor(s) 311. The embedded system 309 may, for example and without limitation, share any or all aspects with the embedded system 109 discussed previously with regard to the exemplary system 100 illustrated in FIG. 1. The embedded system 309 may comprise counters 303, a processor 305, and a memory 307.

The counters 303 may comprise one or more counters that may be operable to count the number of cycles of one or more clock or timebase inputs. For example, the counters 303 may count the number of rising edges detected on each of the clock signals received at its inputs, which may be utilized to gauge clocks.

The on/off-chip clock sources 301 may comprise a plurality of clock sources, some of which may be integrated on the integrated circuit 310 and others may be located off-chip, such as crystal oscillators, which may typically be coupled to printed circuit boards that support the associated integrated circuits utilizing the timebases. For example, the on/off-chip clock sources may comprise the tuning fork crystal 101, the AT-cut crystal 103, and the other timebases 105, described with respect to FIG. 1.

The temperature sensor(s) 311 may comprise one or more sensors that are operable to sense the temperature of local devices and/or circuitry. The temperature sensor(s) 311 may be operable to provide a coarse temperature reading that may be utilized to model temperature dependencies for the clock sources and subsequently generate a more accurate model of clock timing versus temperature. In another exemplary embodiment, one or more of the temperature sensor(s) 311 may be located off-chip.

In an exemplary scenario, models may be created for $TD_i$ and $TD_{ij}$, which are polynomials of temperature that capture the physical behavior of the timebases. $TD_i$ may model the ppm error as a function of temperature for clock source $X_i$, while $TD_{ij}$ may model the differential ppm error between $X_i$ and $X_j$ as a function of temperature. From $TD_{ij}$, a reverse lookup function $DT_{ij}$ may be generated so that, given the differential ppm error and coarse temperature, the reverse lookup function may be utilized to determine the precise temperature. The differential ppm error may be measured precisely by cross-gauging and therefore a high resolution temperature estimate can be obtained from $DT_{ij}$. The accuracy of the temperature estimates largely depends on the accuracy of the model $TD_{ij}$ and may be substantially increased by initiating the process with default models $TD_{id}$ and $TD_{ijd}$, which may be used in the absence of absolute gauging data points (e.g. from a GPS reference) to estimate the fractional temperature change and improve the resolution of even the first gauging data point.

Furthermore, when the model $TD_{ij}$ is generated, the higher-order temperature coefficients of the sources $X_1 \ldots X_n$ may be accurately determined so that when gauging against an absolute timebase becomes available, the remaining coefficients can be more readily estimated with greater accuracy and fewer gauging data points. The exemplary steps for determining the model parameters in the $TD_i$ and $TD_{ij}$ models are described further with respect to FIG. 4.

Clock gauging is the process of measuring the frequency of one timebase against another timebase. The clock signal $X_i$ may be gauged against $X_j$, where $X_j$ is referred to as the reference clock, utilizing two counters $CN_i$ and $CN_j$ to count the number of clock cycles generated by $X_i$ and $X_j$ after a particular point in time, such as an edge of the reference clock, for example. Once $CN_j$ reaches a predetermined number of reference clock cycles $N_{ref}$, the value of $CN_i$ is read, defined as $N_i$. The value $N_{inom}$ may be defined as the nominal value of $CN_i$ when there is no ppm error. Therefore, the ratio of these values $K_i$ may be described by the following equation:

$$K_i = \frac{N_i}{N_{inom}} = \frac{F_i}{F_{inom}} = 1 + PPM_i$$

where $F_i$ is the frequency of $X_i$, $F_{inom}$ is the nominal frequency of $X_i$ and $PPM_i$ is the ppm error of $X_i$. Hence, the ppm error of $X_i$ is given by:

$$PPM_i = K_i - 1$$

The ratio $K_i$ is the estimated frequency of $X_i$ assuming $X_j$ is accurate, normalized to the nominal frequency of $X_i$, $F_{inom}$. $PPM_i$ is the ppm error of $F_i$ when measured against $F_j$, assuming that the reference clock $X_j$ has no ppm error. When the reference has ppm error, the difference of the ppm error may be computed as follows.

If $F_i$ and $F_j$ are defined as the actual frequencies of $X_i$ and $X_j$, respectively, and $F_{inom}$ and $F_{jnom}$ are their nominal frequencies, while $N_i$ and $N_j$ are the number of clock cycles counted in the same period of time, the ratios $K_{ij}$ and $K_{ijnom}$ may be described by:

$$K_{ij} = \frac{N_i}{N_j} = \frac{F_i}{F_j}$$

-continued $$K_{ijnom} = \frac{N_{inom}}{N_{jnom}} = \frac{F_{inom}}{F_{jnom}}$$

Dividing $K_{ij}$ by $K_{ijnom}$ results in:

$$\frac{K_{ij}}{K_{ijnom}} = \frac{F_i/F_{inom}}{F_j/F_{jnom}} = \frac{1+PPM_i}{1+PPM_j} \approx 1 + PPM_i - PPM_j$$

where $PPM_i$ and $PPM_j$ are the frequency drifts of $X_i$ and $X_j$, respectively. The differential ppm error $R_{ij}$ can be defined as:

$$R_{ij} = PPM_i - PPM_j = \frac{K_{ij}}{K_{ijnom}} - 1$$

where $R_{ij}$ represents the differential ppm error of the two frequency sources. Note that if the clock signal $X_j$ has no ppm error (i.e., $PPM_j=0$), then $R_{ij}$ is only but $PPM_i$.

Figure 4:
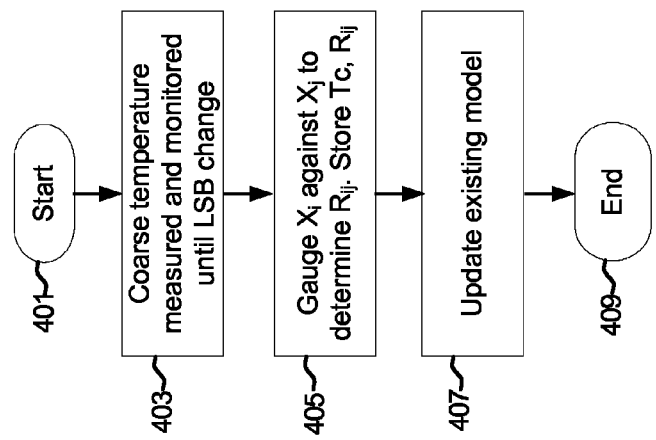
FIG. 4 is a block diagram illustrating exemplary steps in clock source temperature dependency modeling, in accordance with an embodiment of the invention.

FIG. 4 is a block diagram illustrating exemplary steps in clock source temperature dependency modeling, in accordance with an embodiment of the invention. The exemplary method illustrated in FIG. 4 may, for example, share any or all functional aspects discussed previously with regard to FIGS. 1-3. Referring to FIG. 4, after start step 401, in step 403, the temperature sensor(s) 311 may be read to obtain coarse temperature Tc to within the least-significant bit (LSB) of the coarse thermometer, 0.5° C., for example. The coarse temperature may be monitored until the readout changes by one LSB.

In step 405, at the instant the LSB changes, defined as time $t_0$, $X_i$ may be gauged against $X_j$, producing $R_{ij}$. The values for $Tc(t_0)$ and $R_{ij}(t_0)$ may be stored in the memory 307. Step 405 may, for example and without limitation, share any or all functional aspects discussed previously (e.g., with regard to FIGS. 1-3).

In step 407, subsequent data points taken at time $t_k$, indicated by $(Tc(t_k), R_{ij}(t_k))$ are used to improve the model of $TD_{ij}$. As the quality of the model $TD_{ij}$ improves with more data points, the temperature estimates provided by this model become more accurate and reliable (hence, more heavily weighted) relative to the temperature read from the temperature sensor(s) 311. The model may updated by using an exemplary curve fitting algorithm, for example, a least-squares algorithm. The least-squares algorithm may be utilized to determine the optimal model coefficients by minimizing the following fitting error:

$$\|TD_{ij}(Tc) - R_{ij}\|^2$$

where data points $(Tc, R_{ij})$ may be stored in a table, such as in the memory 307, for example. If one or more new data points become available, the table may be updated and the model may thus be updated.

In step 409, the end result of this process is an accurate method of calibrating clock sources by cross-gauging. In instances where the temperature dependencies for clock signals are different, i.e. where $TD_i$ and $TD_j$ are different order polynomials (having order $O(TD_i)$ and $O(TD_j)$ respectively), an accurate $TD_{ij}$ enables the determination of all the coefficients of order k where $k > \min(O(TD_i), O(TD_j))$. For example, for the case of $X_0$ and $X_1$ where $TD_0$ is third order and $TD_1$ is second order, the exemplary steps 401-409 may be used to generate $TD_{01}$, a $3^{rd}$-order polynomial with 4 coefficients. The $3^{rd}$-order coefficient obtained may be identical to the $3^{rd}$-order coefficient for $TD_0$ alone. This allows the system to much more quickly and accurately estimate the remaining coefficients for $TD_0$ and $TD_1$. Since default values for the remaining coefficients are known for $TD_0$ and $TD_1$, these can be reconciled against the measured model for $TD_{ij}$ and the difference between the coefficients can be split among the coefficients for $TD_0$ and $TD_1$, or weighted appropriately if one timebase model is more reliable than the other.

Figure 5:
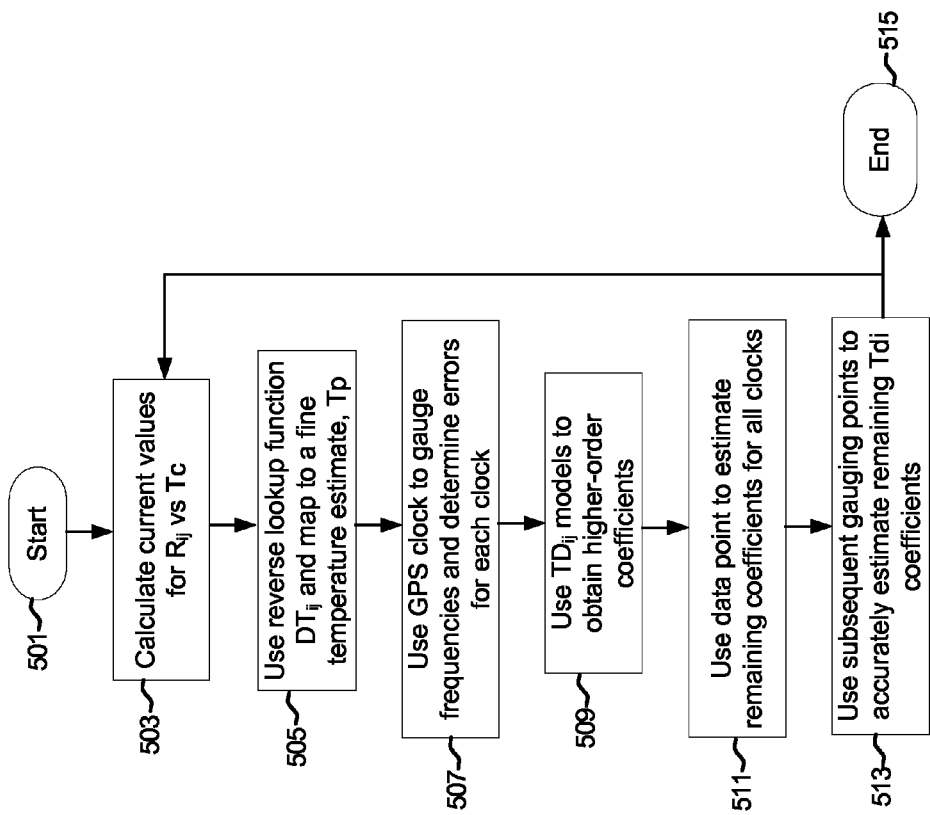
FIG. 5 is a block diagram illustrating exemplary steps in temperature dependency modeling with a calibrated timebase input, in accordance with an embodiment of the invention.

FIG. 5 is a block diagram illustrating exemplary steps in temperature dependency modeling with a calibrated timebase input, in accordance with an embodiment of the invention. The exemplary method illustrated in FIG. 5 may, for example, share any or all functional aspects discussed previously with regard to FIGS. 1-4. The exemplary steps in FIG. 5 may be utilized at any point in the steps described in FIG. 4 when an absolute or calibrated timebase such as GPS becomes available (i.e. the GPS receiver is locked). Referring to FIG. 5, after start step 501, in step 503, current values of the matrix $[R_{ij}]$ and Tc may be calculated.

In step 505, the reverse lookup function $DT_{ij}$ and (Tc, $[R_{ij}]$) may be utilized to determine a precise estimate of the actual temperature, Tp. The value of Tc may be primarily utilized to eliminate any ambiguity that remains with $[R_{ij}]$ due to possible one-to-several mapping of $[R_{ij}]$ to temperature. Step 505 may, for example and without limitation, share any or all functional aspects discussed previously (e.g., with regard to FIGS. 1-4).

In step 507, the GPS timebase may be utilized to gauge the frequencies of each source $X_i$ and determine the ppm errors in each source and their normalized difference $R_{ij}$, which may be denoted by $PPM_0$, $PPM_1$, $PPM_{01}$, respectively.

In step 509, the models $TD_{ij}$ may be utilized to obtain the higher-order coefficients for all available timebases, followed by step 511 where the high accuracy data points ($T_p$, $PPM_0$) and ($T_p$, $PPM_1$) may be utilized to begin estimating the remaining coefficients for $TD_i$ using the same curve-fitting techniques described with respect to FIG. 4.

In step 513, with a sufficient number of gauging points, all remaining coefficients of $TD_i$ may be accurately estimated, followed by end step 515, or the process may loop back to step 503 for continued calculations.

Figure 6:
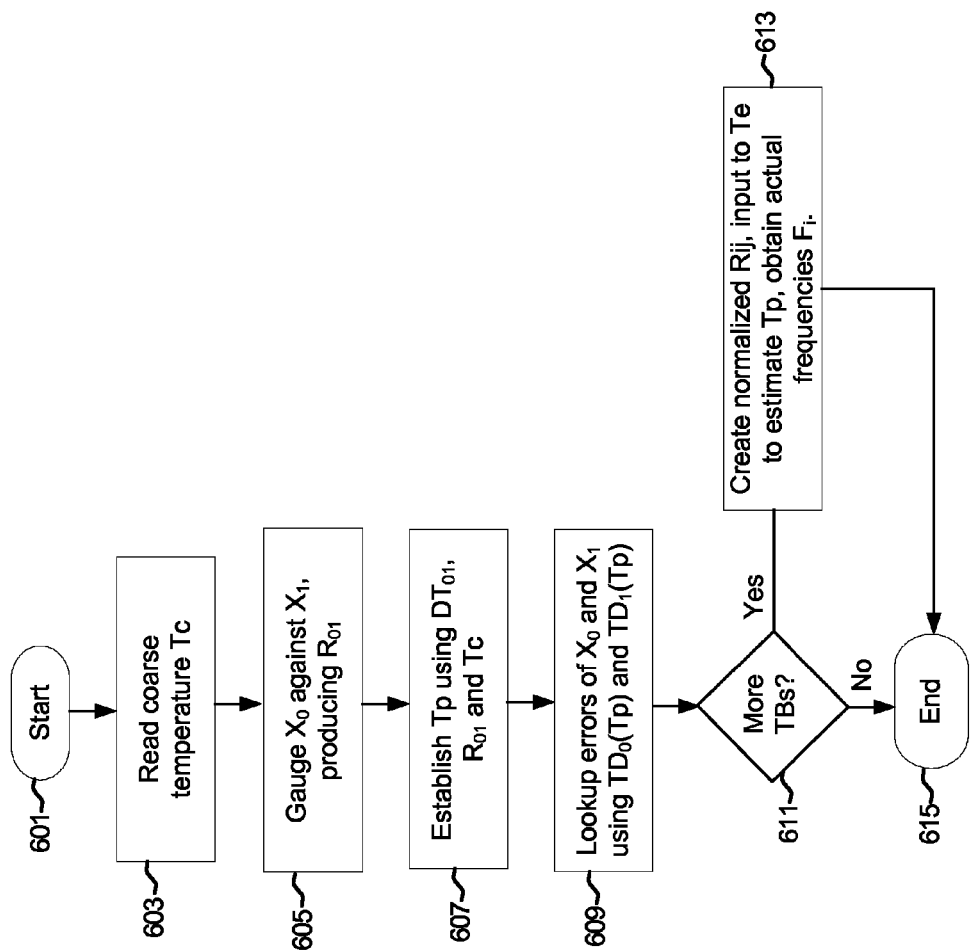
FIG. 6 is a block diagram illustrating exemplary steps in temperature dependency modeling for each timebase, in accordance with an embodiment of the invention.

FIG. 6 is a block diagram illustrating exemplary steps in temperature dependency modeling for each timebase, in accordance with an embodiment of the invention. The exemplary method illustrated in FIG. 6 may, for example, share any or all functional aspects discussed previously with regard to FIGS. 1-5. The exemplary steps in FIG. 6 may be utilized to precisely estimate the ppm error of a given source $X_i$. The basic operation of the system using two timebases $X_0$ and $X_1$ may involve the exemplary steps of FIG. 6. Referring to FIG. 6, after start step 601, in step 603, the temperature sensor(s) 311 may be read to obtain coarse temperature Tc to within the resolution of the coarse thermometer (say, 0.5° C.).

In step 605, $X_0$ may be gauged against $X_1$, producing $R_{01}$. Step 605 may, for example and without limitation, share any or all functional aspects discussed previously (e.g., with regard to FIGS. 1-5).

In step 607, the values Tc and $R_{01}$ and the reverse look-up function $DT_{01}$ may be utilized to establish the precise temperature Tp, using the model for $DT_{01}$ developed in the exemplary steps described with respect to FIGS. 4 and 5.

In step 609, the timebase errors of $X_0$ and $X_1$, in ppm, may be looked up using their respective models $TD_0(Tp)$ and $TD_1(Tp)$.

In step 611, if more independent timebases $X_2$-$X_n$ are available, a symmetric matrix of normalized differences $R_{ij}$ may be created. $R_{ij}$ may be used as an input to Te, an algorithm for more accurately estimating Tp, in conjunction with the coarse temperature Tc. The calculation of Te may incorporate signal processing of $[R_{ij}]$ and Tc to improve accuracy.

For example, the elements of $L_i$, the column vectors of $[R_{ij}]$, may be combined in a weighted average, depending on physical proximity to timebase $X_i$, and depending on the quality or reliability of that timebase. A voting scheme which discards outliers may be used to avoid incorporating spurious readings and transient environmental influences. Furthermore, Kalman filtering may be applied to $[R_{ij}]$ over time to optimize the estimate of Te, given noise in the measurement of $[R_{ij}]$, as well as knowledge of past values of $[R_{ij}]$ and Te.

Finally, the ppm estimates $PPM_j$ for the other timebases Xj obtained from models $TD_j$ can be incorporated to improve the estimate of $PPM_i$ by calculating the frequency $F_{iw}$ from the element $R_{ij}$ ($=-R_{ji}$), in addition to using the techniques above. Having established the estimated ppm error of each timebase $X_i$, corrections may be applied to obtain the actual frequencies $F_i$ of each source $X_i$. Step 611, or step 613 if step 611 resulted in a YES, may be followed by end step 615.

In an embodiment of the invention, a method and system may comprise measuring a coarse reading Tc of a temperature corresponding to the plurality of timebases $X_0$-$X_N$. The frequencies of the plurality of timebases $X_0$-$X_N$ may be compared at the temperature corresponding to the pluralities of the timebases $X_0$-$X_N$. A fine reading Te of the temperature corresponding to the plurality of timebases $X_0$-$X_N$ may be generated based, at least in part, on the coarse reading Tc and the comparison of the frequencies with respect to models of temperature dependencies $TD_i$, $TD_j$ for each of the plurality of timebases $X_0$-$X_N$. The plurality of timebases $X_0$-$X_N$ may be calibrated utilizing the generated fine reading Te of the temperature corresponding to the plurality of timebases $X_0$-$X_N$.

The plurality of timebases $X_0$-$X_N$ may comprise different order temperature dependencies. The models of temperature dependencies $TD_i$, $TD_j$ of each of the plurality of timebases $X_0$-$X_N$ may be updated based, at least in part, on the fine reading of the temperature corresponding to the plurality of timebases $X_0$-$X_N$. A global navigation satellite system (GNSS) clock signal 105 may be utilized periodically to improve the accuracy of the calibration of the plurality of timebases $X_0$-$X_N$. The GNSS clock signal may comprise one or more of: a GPS clock signal, GLONASS clock signal, and/or a Galileo clock signal.

The accuracy of the models of temperature dependencies for each of the plurality of timebases $X_0$-$X_N$ may be successively increased through one or more of: averaging, voting, and/or Kalman filtering. The plurality of timebases $X_0$-$X_N$ may be calibrated utilizing an embedded system 309 in an integrated circuit 310. One or more of the plurality of timebases $X_0$-$X_N$ may be generated on the integrated circuit 310 or coupled into the integrated circuit 310. One or more of the plurality of timebases $X_0$-$X_N$ may be generated by a crystal oscillator 101, 103.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for precise temperature and timebase ppm error estimation using multiple timebases.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system may primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for calibrating electronic clock signals, the method comprising:
   in an electronic device comprising a plurality of timebases:
      measuring a coarse reading of a temperature corresponding to said plurality of timebases;
      comparing frequencies of said plurality of timebases at said temperature corresponding to said pluralities of said timebases;
      generating a fine reading of said temperature corresponding to said plurality of timebases based, at least in part, on said coarse reading and said comparison of said frequencies with respect to models of temperature dependencies for each of said plurality of timebases;
      calibrating said plurality of timebases utilizing said generated fine reading of said temperature corresponding to said plurality of timebases.

2. The method according to claim 1, wherein said plurality of timebases comprise different order temperature dependencies.

3. The method according to claim 1, comprising updating said models of temperature dependencies of each of said plurality of timebases based, at least in part, on said fine reading of said temperature corresponding to said plurality of timebases.

4. The method according to claim 1, comprising periodically utilizing a global navigation satellite system (GNSS) clock signal to improve the accuracy of said calibration of said plurality of timebases.

5. The method according to claim 4, wherein said GNSS clock signal comprises one or more of: a GPS clock signal, GLONASS clock signal, and/or a Galileo clock signal.

6. The method according to claim 1, comprising successively increasing the accuracy of said models of temperature dependencies for each of said plurality of timebases through one or more of:
   averaging, voting, and/or Kalman filtering.

7. The method according to claim 1, comprising calibrating said plurality of timebases utilizing an embedded system in an integrated circuit.

8. The method according to claim 7, wherein one or more of said plurality of timebases is generated on said integrated circuit.

9. The method according to claim 7, wherein one or more of said plurality of timebases is coupled into said integrated circuit.

10. The method according to claim 1, wherein one or more of said plurality of timebases is generated by a crystal oscillator.

11. A system for calibrating electronic clock signals, the system comprising:
    one or more circuits for use in an electronic device comprising a plurality of timebases, said one or more circuits being operable to:
       measure a coarse reading of a temperature corresponding to said plurality of timebases;
       compare frequencies of said plurality of timebases at said temperature corresponding to said pluralities of said timebases;
       generate a fine reading of said temperature corresponding to said plurality of timebases based, at least in part, on said coarse reading and said comparison of said frequencies with respect to models of temperature dependencies for each of said plurality of timebases; and
       calibrate said plurality of timebases utilizing said generated fine reading of said temperature corresponding to said plurality of timebases.

12. The system according to claim 11, wherein said plurality of timebases comprise different order temperature dependencies.

13. The system according to claim 11, wherein said one or more circuits is operable to update said models of temperature dependencies of each of said plurality of timebases based, at least in part, on said fine reading of said temperature corresponding to said plurality of timebases.

14. The system according to claim 11, wherein said one or more circuits is operable to periodically utilize a global navigation satellite system (GNSS) clock signal to improve the accuracy of said calibration of said plurality of timebases.

15. The system according to claim 14, wherein said GNSS clock signal comprises one or more of: a GPS clock signal, GLONASS clock signal, and/or a Galileo clock signal.

16. The system according to claim 11, wherein said one or more circuits is operable to successively increase the accuracy of said models of temperature dependencies for each of said plurality of timebases through one or more of: averaging, voting, and/or Kalman filtering.

17. The system according to claim 11, wherein said one or more circuits is operable to calibrate said plurality of timebases utilizing an embedded system in an integrated circuit.

18. The system according to claim 17, wherein one or more of said plurality of timebases is generated on said integrated circuit.

19. The system according to claim 17, wherein one or more of said plurality of timebases is coupled into said integrated circuit.

20. A system for electronic clock signals, the system comprising:
   an integrated circuit that utilizes a plurality of timebases, said integrated circuit being operable to:
      measure a coarse reading of a temperature corresponding to said plurality of timebases;
      compare frequencies of said plurality of timebases at said temperature corresponding to said pluralities of said timebases;
      generate a fine reading of said temperature corresponding to said plurality of timebases based, at least in part, on said coarse reading and said comparison of said frequencies with respect to models of temperature dependencies for each of said plurality of timebases; and
      calibrate said plurality of timebases utilizing said generated fine reading of said temperature corresponding to said plurality of timebases.

* * * * *